(12) United States Patent
Kanakasabai et al.

(10) Patent No.: US 10,557,901 B2
(45) Date of Patent: Feb. 11, 2020

(54) SYSTEMS AND METHODS FOR PROVIDING GRADIENT POWER FOR AN MRI SYSTEM

(71) Applicant: General Electric Company, Schenectady, NY (US)

(72) Inventors: Viswanathan Kanakasabai, Bangalore (IN); Jayanti Ganesh, Bangalore (IN); Juan Antonio Sabate, Wilton, NY (US)

(73) Assignee: General Electric Company, Schenectady, NY (US)

( * ) Notice: Subject to any disclaimer, the term of this patent is extended or adjusted under 35 U.S.C. 154(b) by 75 days.

(21) Appl. No.: 15/901,742

(22) Filed: Feb. 21, 2018

(65) Prior Publication Data
US 2019/0257902 A1    Aug. 22, 2019

(51) Int. Cl.
*G01R 33/385* (2006.01)
*H02M 3/335* (2006.01)
*H03F 3/217* (2006.01)
*H02M 3/337* (2006.01)

(52) U.S. Cl.
CPC ........ *G01R 33/3852* (2013.01); *H02M 3/337* (2013.01); *H02M 3/33569* (2013.01); *H02M 3/33576* (2013.01); *H03F 3/2173* (2013.01); *H03F 2200/261* (2013.01)

(58) Field of Classification Search
CPC .............. G01R 33/3852; H03F 3/2173; H03F 2200/261; H02M 3/33569
See application file for complete search history.

(56) References Cited

U.S. PATENT DOCUMENTS

| 5,270,657 A | 12/1993 | Wirth et al. | |
| 5,973,527 A * | 10/1999 | Schweighofer | .... G01R 33/3852 327/172 |
| 2006/0114623 A1 * | 6/2006 | Domoto | ............ G01R 33/3852 361/18 |
| 2008/0191695 A1 * | 8/2008 | Van Helvoort | .... G01R 33/3415 324/314 |
| 2009/0234218 A1 * | 9/2009 | Washburn | ............... A61B 5/055 600/410 |
| 2010/0045113 A1 * | 2/2010 | Hishikawa | ......... G01R 33/3614 307/77 |

(Continued)

OTHER PUBLICATIONS

Sabate, Juan, et al.; "High-Power High-Fidelity Switching Amplifier Driving Gradient Coils for MRI Systems", Power Electronics Specialists Conference, pp. 20-25, Jun. 2004.

(Continued)

*Primary Examiner* — G. M. A Hyder

(57) ABSTRACT

Power systems and circuitry for generation of gradient magnetic fields in magnetic resonance imaging (MRI) systems are discussed herein. Embodiments may include the use of multiple gradient amplifiers that share a high-frequency power distribution unit, that may perform power distribution and power supply roles. The high-frequency power distribution unit may allow the use of a single power supply to drive multiple gradient amplifiers via a shared power bus. The gradient amplifiers may make use of modern semiconductor materials that provide high-frequency, high voltage performance, and may be implemented using single semiconductor bridges.

9 Claims, 9 Drawing Sheets

(56) References Cited

U.S. PATENT DOCUMENTS

| | | |
|---|---|---|
| 2011/0090719 A1* | 4/2011 | Benjamin ............... H02M 7/44 |
| | | 363/34 |
| 2012/0249145 A1 | 10/2012 | Lai et al. |
| 2012/0275195 A1* | 11/2012 | Cividino ................ H02M 3/28 |
| | | 363/15 |
| 2013/0162250 A1 | 6/2013 | Sabate et al. |
| 2013/0285664 A1 | 10/2013 | Scheel et al. |
| 2014/0077812 A1* | 3/2014 | Sabate ............... G01R 33/3852 |
| | | 324/319 |
| 2015/0054509 A1 | 2/2015 | Smits et al. |
| 2015/0085969 A1* | 3/2015 | Mekonnen .............. H05G 1/10 |
| | | 378/4 |
| 2015/0177345 A1 | 6/2015 | Ham et al. |
| 2015/0234021 A1 | 8/2015 | Yu et al. |
| 2017/0102441 A1* | 4/2017 | Ganesh .................. A61B 5/055 |
| 2017/0160358 A1* | 6/2017 | Miura ................ G01R 33/3852 |
| 2017/0285119 A1* | 10/2017 | Kanakasabai ...... G01R 33/3614 |

OTHER PUBLICATIONS

Mauerer, M., et al.; "Distortion Analysis of Low-THD/High-Bandwidth GaN/SiC Class-D Amplifier Power Stages", Energy Conversion Congress and Exposition, pp. 20-24 Sep. 2015.
Sabate, Juan, et al.; "Magnetic Resonance Imaging Power: High-Performance MVA Gradient Drivers", IEEE Journal of Emerging and Selected Topics in Power Electronics, vol. 04, Issue 01, pp. 280-292, Mar. 2016.

\* cited by examiner

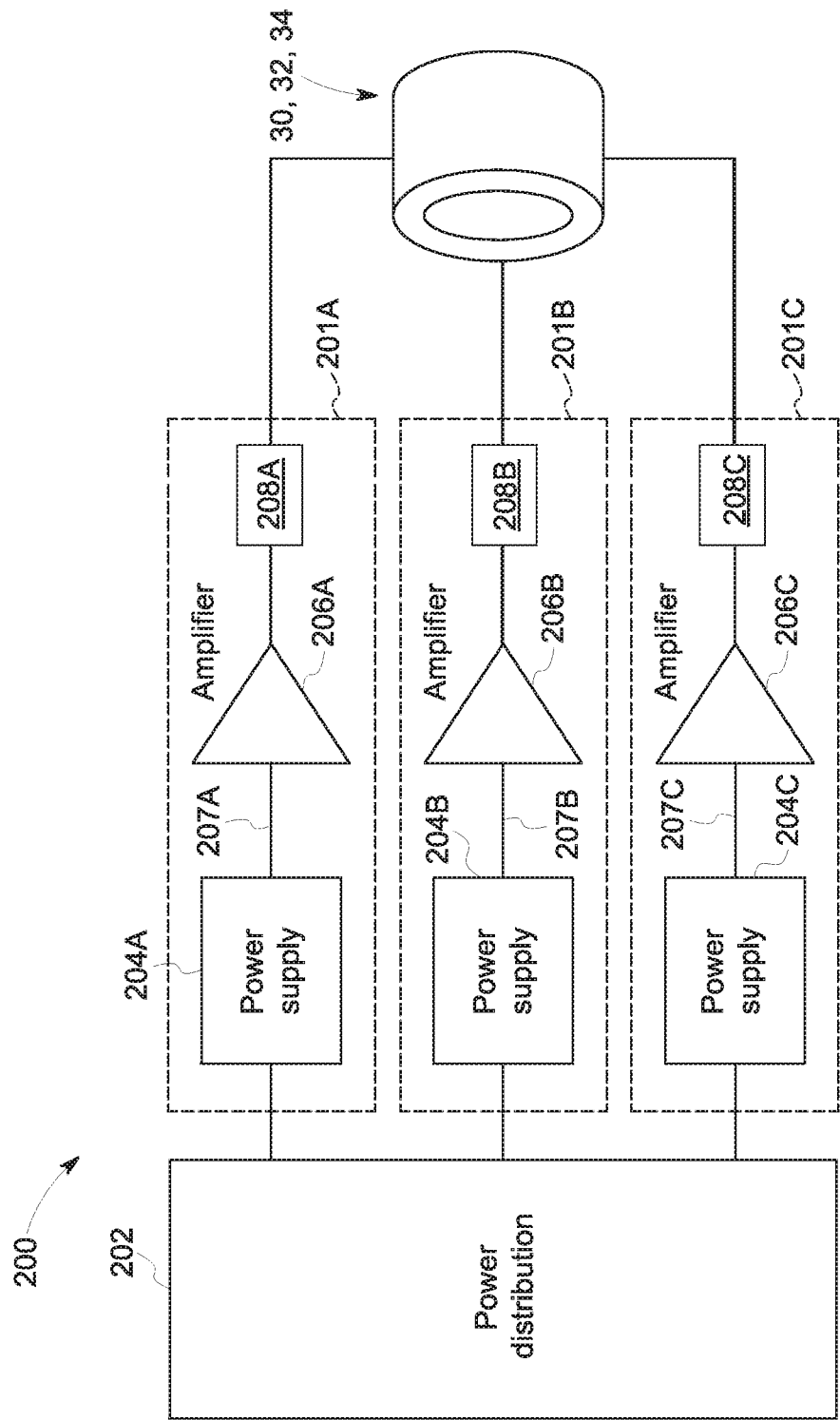

SYSTEMS AND METHODS FOR PROVIDING GRADIENT POWER FOR AN MRI SYSTEM

BACKGROUND

The subject matter disclosed herein relates to magnetic resonance imaging equipment (MRI), and more specifically, to systems that provide accurate high power currents to, for example, drive gradient coils.

This section is intended to introduce the reader to certain aspects of art that may be related to aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Magnetic resonance imaging (MRI) is an imaging modality that is often used to generate images (e.g., spatial maps) based on the distribution of molecules in a subject. Generally, an MRI image of a subject (e.g., a patient) is produced by measuring properties of the gyromagnetic materials of the subject, such as hydrogen nuclei. These properties are usually obtained by measuring emissions from the gyromagnetic materials within the subject in response to an excitation from applied magnetic fields. The magnetic fields used for excitation generally include a strong primary magnetic field, magnetic field gradients, and radiofrequency (RF) magnetic field excitation pulses. Of note, the magnetic field gradients may be used by the MRI system to provide spatial encoding to the acquired data. To that end, the gradient coils may be used to generate spatial gradients of magnetic fields such that spatial coordinates of the subject may be associated with a locally encoded magnetic field value. As a result of this magnetic field-based encoding, the emission from the gyromagnetic materials may contain information that may be used to inform the spatial origin of a particular emission during image reconstruction.

The magnetic field gradients may be obtained by driving specific currents to the gradient coils. More specifically, these magnetic field gradients may be controlled by adjustment of the currents in the gradient coils that are responsible for generating magnetic fields. Magnetic coils may be associated with each one of spatial axes, the x-axis, the y-axis, and the z-axis, and the current in each of the axis coils may be independently controlled during the course of the data acquisition, to obtain flexible three-dimensional slicing of the images. To generate the currents in the magnetic coils, magnetic coil drivers may be used. A magnetic driver may include a gradient power supply and a gradient amplifier (e.g., a current amplifier) that can induce currents in the magnetic coil. Magnetic coil drivers may demand very accurate currents for precise, high-resolution spatial encoding. Moreover, the currents and voltages required to drive the current in the magnetic coils can be very large and varying. As a result, the design for the power supplies in these systems may be particularly challenging due to the large current changes and the large voltages normally used by the amplifiers.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In an embodiment, a magnetic resonance imaging (MRI) system is described. The MRI system may include multiple gradient coils and a gradient driver that drives the gradient coils. The gradient driver may include multiple gradient amplifiers and each gradient amplifier may independently control the current in the gradient coil by an electric coupling. Moreover, each gradient amplifier employs a single semiconductor bridge to perform the control. The gradient driver also includes a power distribution unit (PDU). The PDU may receive an alternating current (AC) power signal from the main power source of the MRI system and provide a direct current (DC) power signal to the gradient amplifiers via a DC bus.

In another embodiment, a High Frequency Power Distribution Unit (HFPDU) is described. The HFPDU may include a power distribution unit and a power supply. The power distribution unit may have a line filter and a first rectifier. The power distribution unit may receive a three-phase AC power signal from a power source and generates an intermediate DC signal. The power supply includes a semiconductor bridge, a high-frequency transformer, a high speed rectifier, and a filter. The semiconductor bridge may receive the intermediate DC signal of the rectifier and generate a high frequency AC power signal. The high frequency AC power signal may be provided to the high-frequency transformer, which may provide galvanic insulation. Moreover, a shield of the transformer may be coupled to a safety ground. The AC power from the transformer may be provided to the high-speed rectifier to produce an output DC power signal.

In a further embodiment, a gradient amplifier is described. The gradient amplifier may drive a gradient coil in an MRI system. The gradient amplifier may have a single semiconductor bridge having a first branch that includes a first and a second switch. A first terminal of the gradient coil may be coupled to a midpoint of the first branch. The single semiconductor bridge may have a second branch that includes a third and a fourth switch. A second output terminal of the gradient coil may be coupled to a midpoint of the second branch. The first and the second branches are arranged in parallel with respect to an input DC bus. The first and the second terminals provide a signal that may be used to drive the gradient coil via, for example, a ripple filter.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 3 is a diagram of a traditional gradient power architecture having isolated circuitries for gradient amplification, in accordance with an embodiment;

DETAILED DESCRIPTION

Figure 1:
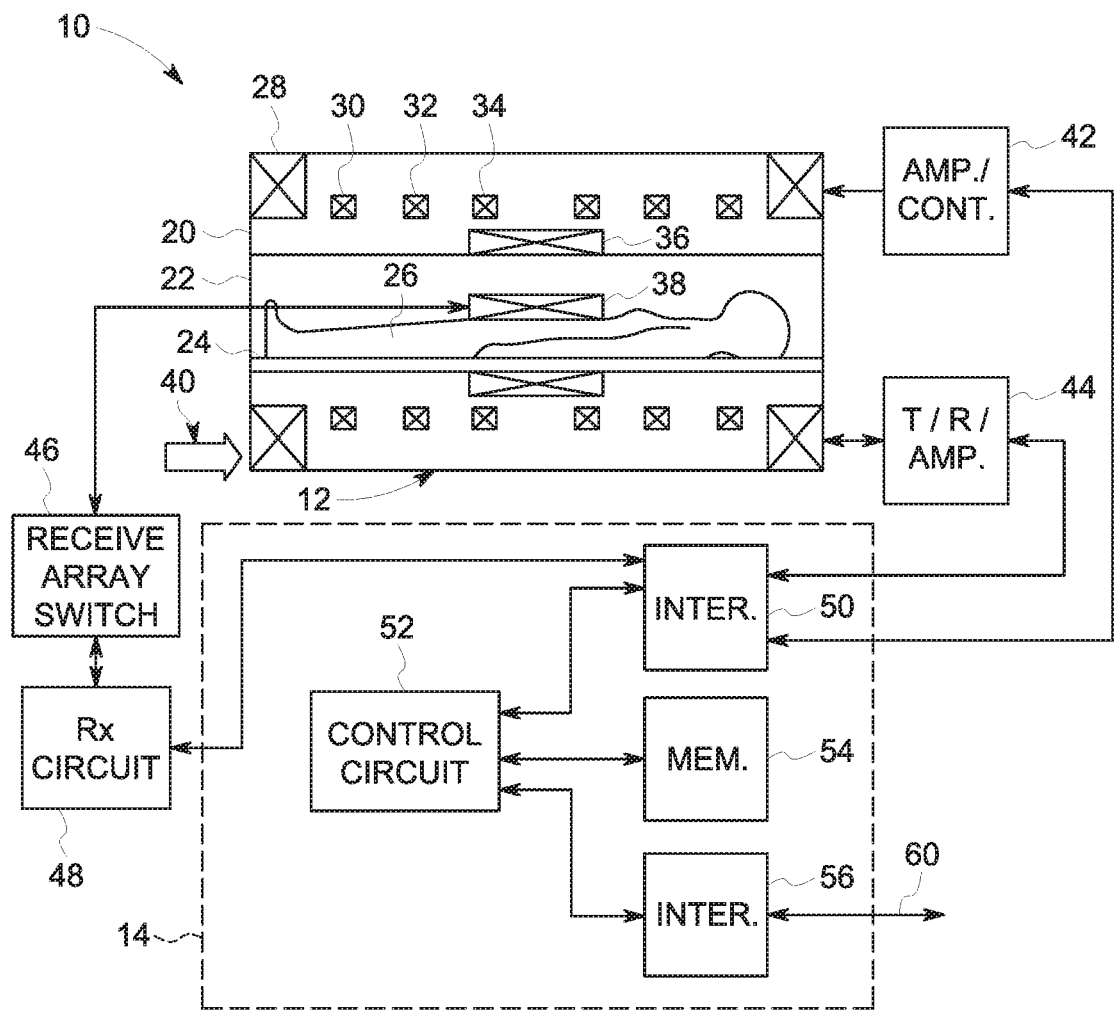
FIG. 1 is a diagram of a magnetic resonance imaging (MRI) system that employs a gradient power architecture, in accordance with an embodiment of the present disclosure.

One or more specific embodiments will be described below. In an effort to provide a concise description of these embodiments, certain features of an actual implementation may be omitted in the specification. It should be appreciated that in the development of any such actual implementation, as in any engineering or design project, numerous implementation-specific decisions must be made to achieve the developers' specific goals, such as compliance with safety-related, system-related, and business-related constraints, which may vary from one implementation to another. Moreover, it should be appreciated that such a development effort might be complex and time consuming, but would nevertheless be a routine undertaking of design, fabrication and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Magnetic resonance imaging (MRI) uses systems and devices that produce an image by mapping specific properties of gyromagnetic materials of the subject being imaged. More specifically, MRI systems excite gyromagnetic nuclei of the subject with strong magnetic fields and measure the radiofrequency (RF) emissions from the excited gyromagnetic nuclei in response to the excitation. The magnetic fields employed may be from multiple magnetic field sources in the MRI system. For example, the subject may be immersed by a strong constant magnetic field from a main coil, variable magnetic field gradients that provide spatial encoding, and RF excitation pulses that may have a frequency at or close to the resonance frequencies of the gyromagnetic nuclei. The variable magnetic field gradients may be used to add a spatial localization to the RF emissions from the gyromagnetic nuclei, which may be used to produce an image. The RF excitation pulses may be applied by RF excitation coils and may be used to excite the magnetization vector of the gyromagnetic materials through precession. A pulse sequence, a specific series of applications of these magnetic fields to the subject, may be employed to obtain suitable data from the MRI system to produce an image of an object.

The present application is generally related to systems and circuits that may be used to generate the variable magnetic field gradients. The magnetic field gradients can be generated by means of gradient coils, coils that may generate magnetization associated with spatial directions. For example, a two-dimensional MRI system may have two gradient coils (e.g., longitudinal, transversal) and a three-dimensional MRI system may have three gradient coils, with one gradient coil associated with each spatial direction (e.g., longitudinal, axial, transversal). Each gradient coil may be controlled independently from the other gradient coils to create strong magnetic fields. Moreover, the magnetization provided by the gradient coils may be adjusted over the course of the data acquisition procedure, to generate multi-dimensional images of the subject. As such, the circuitry driving the gradient coils, referred herein as the gradient coil driver circuitry, may have stringent performance specifications due to the high frequency switching, the large voltages and currencies, and the accuracy demands.

In order to satisfy the accuracy, high frequency, and large power specifications, traditional gradient power architectures often include gradient drivers with multilevel converters employing multiple cascaded semiconductor bridges. This type of design may allow high current accuracy while operating under the high powers employed when driving the gradient coils. However, the traditional gradient power architecture is bulky as it employs a large number of components. In the present disclosure, a more efficient design for a gradient power architecture is discussed. The present embodiments may use an integrated gradient power supply, or high-frequency power distribution unit (HFPDU), which may be capable of providing a reliable direct current (DC) output to the gradient amplifiers. The embodiments may also employ gradient amplifiers with a single bridge design to drive the coils, which may reduce power losses in the amplifier and the energy storage requirement at the input of the amplifier due to a shared DC bus across multiple axes. In another embodiment, a method of grounding the system that reduces cross-talk between axes is also disclosed. The present embodiments may employ simplified amplifier design by reducing the number of bridges within the gradient amplifiers. To that end, the switches and/or semiconductor bridges employed in the HFPDU and/or the gradient amplifiers may be implemented using high voltage wide band-gap devices (e.g., Silicon Carbide devices).

While the devices discussed herein are provided in the context of gradient amplifiers for MRI systems, it should be understood that the present embodiments for the simplified high-power, high-frequency circuitry may be used to improve other systems that may employ multi-level converters by the simplification of the semi-conductor bridges, as understood in the art. With the foregoing in mind, FIG. 1 illustrates an example of an MRI system 10. The MRI system 10 includes a scanner 12 and a scanner control system 14. The scanner 12 may have a housing 20 around a bore 22. A movable table 24 may be used to allow a patient 26 to be positioned within the bore 22. The housing 20 of the scanner 12 may also include a primary magnet 28, which may establish a primary magnetic field for data acquisition. Magnetic gradient coils 30, 32 and 34 positioned in the scanner 12 may provide a magnetic field gradient that provides spatial encoding of the gyromagnetic nuclei of the patient 26 during the imaging process. An RF excitation coil 36 of the MRI system 10 may generate radiofrequency (RF) pulses for excitation of part of the gyromagnetic nuclei of the patient 26 during the imaging process. The MRI system 10 may also be provided with acquisition coils 38, which may read out RF signals produced by gyromagnetic nuclei within the patient 26 as the nuclei go from an excited state to a relaxed state. In some embodiments, the RF excitation coil 36 and the acquisition coil 38 may be substantially the same. The various coils and magnets of the scanner 12 may be powered by a main power supply 40.

The magnetic gradient coils 30, 32, 34, that may be associated with an x-axis, a y-axis, and a z-axis, may be controlled by a gradient driver circuit 42, which may adjust each spatial axis independently. The gradient driver circuit 42 may be powered by the main power supply 40. The gradient driver circuit 42 may include gradient power supplies, and amplifiers that may control the gradients associated with the three axes independently, as detailed below. The RF excitation coil 36 may be controlled by an RF driver circuit 44. Receive circuit 48 may acquire RF signals detected by the acquisition coil 38 and processed by a receive array switch 46. The driver circuits 42 and 44, and the receive circuit 48 may be coupled, through an interface 50, to a controller 52. Interface 50 may include memory banks and/or buffers that may be used to route the communication between the controller 52 and the driver circuits 42, 44, and receive circuit 48. The controller 52 may include a general-purpose processor, an application-specific integrated circuit (ASIC) and/or a programmable logic device (PLD). The controller 52 may further communicate with a memory circuitry 54, which may store data acquired through the receive circuit 48. The memory circuitry 54 may also store instructions for the controller 52 in the form of imaging protocols. The imaging protocols may include instructions for the driver circuits 42 and 44 to control the gradient coils 30, 32, 34 and the RF excitation coil 36, respectively, in a particular manner. Moreover, scanner control system 14 may have an interface 56 that allows a connection 60 between the MRI system 10 and other external equipment such as a computer cluster for image reconstruction or registration, a medical database, a diagnostic system, a PACS system, a display, a printer, a 3-D visualization interface or any other device that may use MRI images or data. The memory circuitry 54 may also store instructions to control the gradient coils 30, 32, and 34, by adjusting the currents in the coils via gradient driver circuitry 42.

Figure 2:
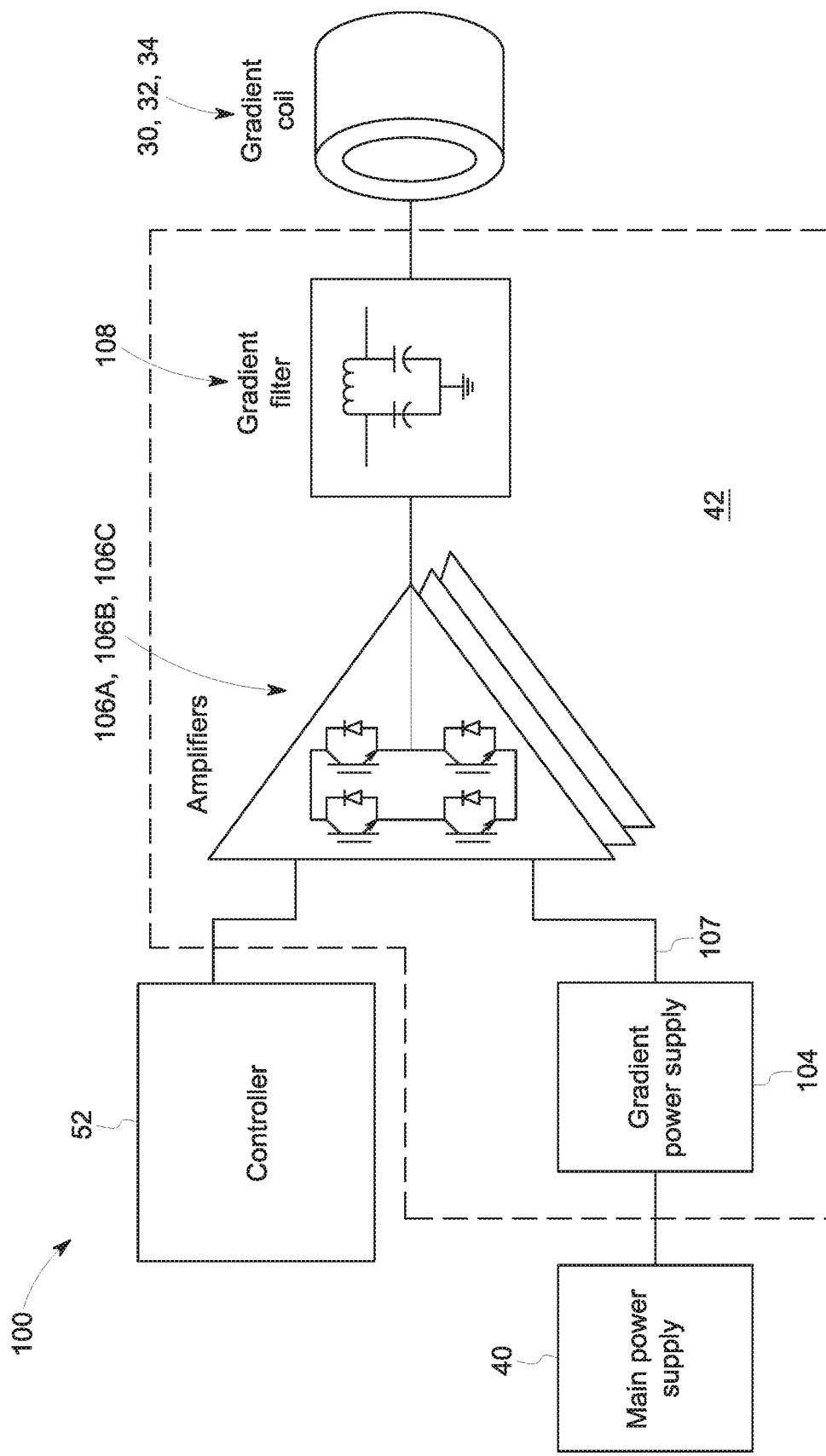
FIG. 2 is a diagram of a gradient power architecture using integrated power supply and gradient amplifiers, in accordance with an embodiment

In order to control the gradient coils to generate the spatial encoding magnetic field gradients, the gradient driver may include a group of amplifiers. The MRI gradient power architecture 100, illustrated in FIG. 2, is a simplified power architecture that may be used to implement the gradient driver circuitry 42. In the illustrated gradient driver circuitry 42, the main power supply 40 provides the power that may be used by the gradient driver circuitry 42. As an example, the main power supply may provide an alternating current (AC) signal. The voltage provided by the main power supply may have different rated voltages and/or frequency based on the geographical location or of the available power grid. For example, the voltages may be 380V, 415V, 480V, etc., and the signal frequency may be 50/60 Hz. The main power supply 40 may supply power to the several single phase and three-phase MRI current drivers, including the gradient driver 42.

The gradient driver circuit 42 may include the high-frequency power distribution unit (HFPDU) 104, and the gradient amplifiers 106A, 106B, and 106C. The HFPDU 104 may be coupled to the power supply 40, and may be receive three phases of the power supply 40. The HFPDU 104 may provide a direct current (DC) signal to the gradient amplifiers 106A, 106B, and 106C via a shared DC bus 107. In the illustrated example, the gradient amplifiers 106A, 106B, and 106C are responsible for driving the gradient coils 30, 32, and 34. Each amplifier may be associated with a corresponding gradient coils. In the example, gradient amplifiers 106A, 106B, and 106C may drive the gradient coils 30, 32, and 34, respectively. The controller 52 may control the provided currents and voltages and, ultimately, may control the magnetic gradients that provide spatial encoding during acquisition of data. To that end, the controller 52 may control switches (e.g., switches in the semiconductor bridges) in gradient amplifiers 106A, 106B, and 106C, to induce specific currents and/or voltages in the gradient coils 30, 32, and 34, respectively.

As discussed above, the currents and voltages that drive gradient coils may be very large and subject to fast switching. Due to the stringent performance specifications, traditional power architectures may replicate several circuits and components, and include strong insulation structures in the power supplies, amplifiers, and gradient coils. The diagrams in FIGS. 3, 4A, 4B, and 4C are provided to illustrate the challenges present in traditional gradient power architecture systems. It should, however, be noted that teachings of the present application may be used within traditional power architectures, and as such, FIGS. 3, 4A, 4B, and 4C may also be embodiments of the present disclosure. In view of this, the gradient power architecture 200 in FIG. 3 shows three driver circuits 201A, 201B, and 201C, whose outputs are electrically isolated from each other. Driver circuits 201A, 201B, and 20C drive the gradient coils 30, 32, and 34, respectively. In the provided example, a power distribution unit 202 may be coupled to the power supply of the MRI system (e.g., main power supply 40), and may provide power signals to driver circuits 201A, 201B, and 201C. In an embodiment, the power distribution unit 202 may be a transformer that is coupled to the phases of the main power supply of the MRI system, and may provide an AC signal to the driver circuits 201A, 201B, and 201C.

Each driver circuit may receive the power signal from the power distribution unit 202. In the example, a gradient power supply 204A receives the power signal from the power distribution unit 202. The illustrated gradient power supply 204A generates multiple DC voltages, that are isolated from one another, which are provided to the gradient amplifier 206A. The multiple DC voltages in the gradient power supply 204A may facilitate generation of accurate currents to the gradient coil 30 by the multilevel converters used in the design of the gradient amplifier 206A. Similarly, a gradient power supply 204B may generate multiple isolated DC voltages to the gradient amplifier 206B, which may drive gradient coil 32, and gradient power supply 204C may generate multiple isolated DC voltages to the gradient power amplifier 206C, which may drive gradient coil 34. Note that, in this design, the gradient power supply 204A is coupled the gradient amplifier 206A via multiple dedicated DC buses 207A, gradient power supply 204B is coupled to the gradient amplifier 206B via dedicated DC buses 207B, and gradient power supply 204C is coupled to the gradient amplifier 206C via the dedicated DC buses 207C. The dedicated DC buses 207A, 207B, and 207C are decoupled from each other, to prevent cross-interference between the signals. Note, moreover, that each isolated circuitry may have a ripple filter, between the gradient amplifier and the gradient coil. Ripple filters 208A, 208B, and 208C may be disposed in driver circuits 201A, 201B, and 201C to filter noise in the currents transmitted to the gradient coils 30, 32, and 34, respectively.

Figure 4A:
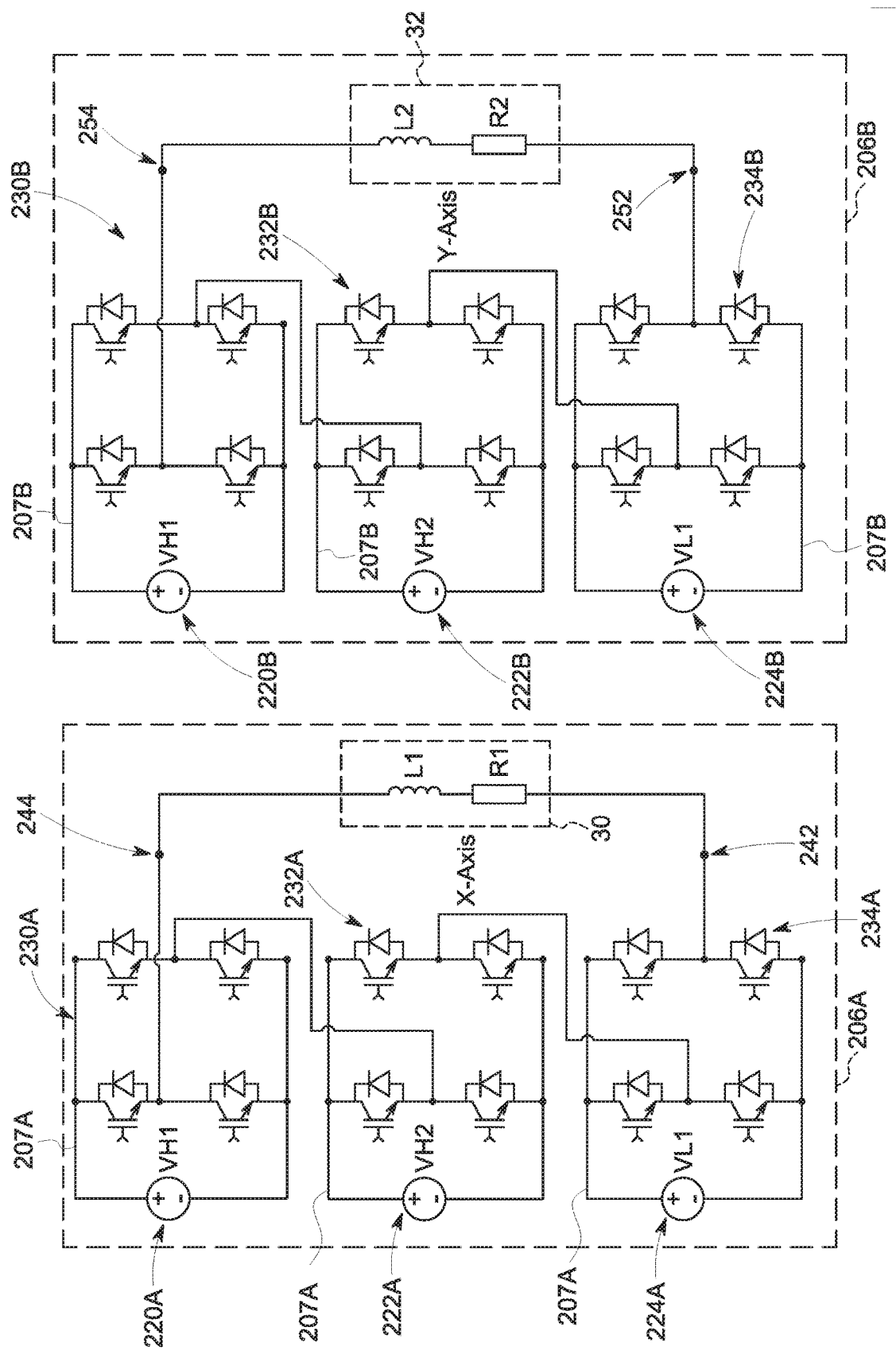
FIG. 4A is a diagram of traditional isolated gradient amplifiers with a H-bridge design and with isolated DC buses, in accordance with an embodiment.
Figure 4B:
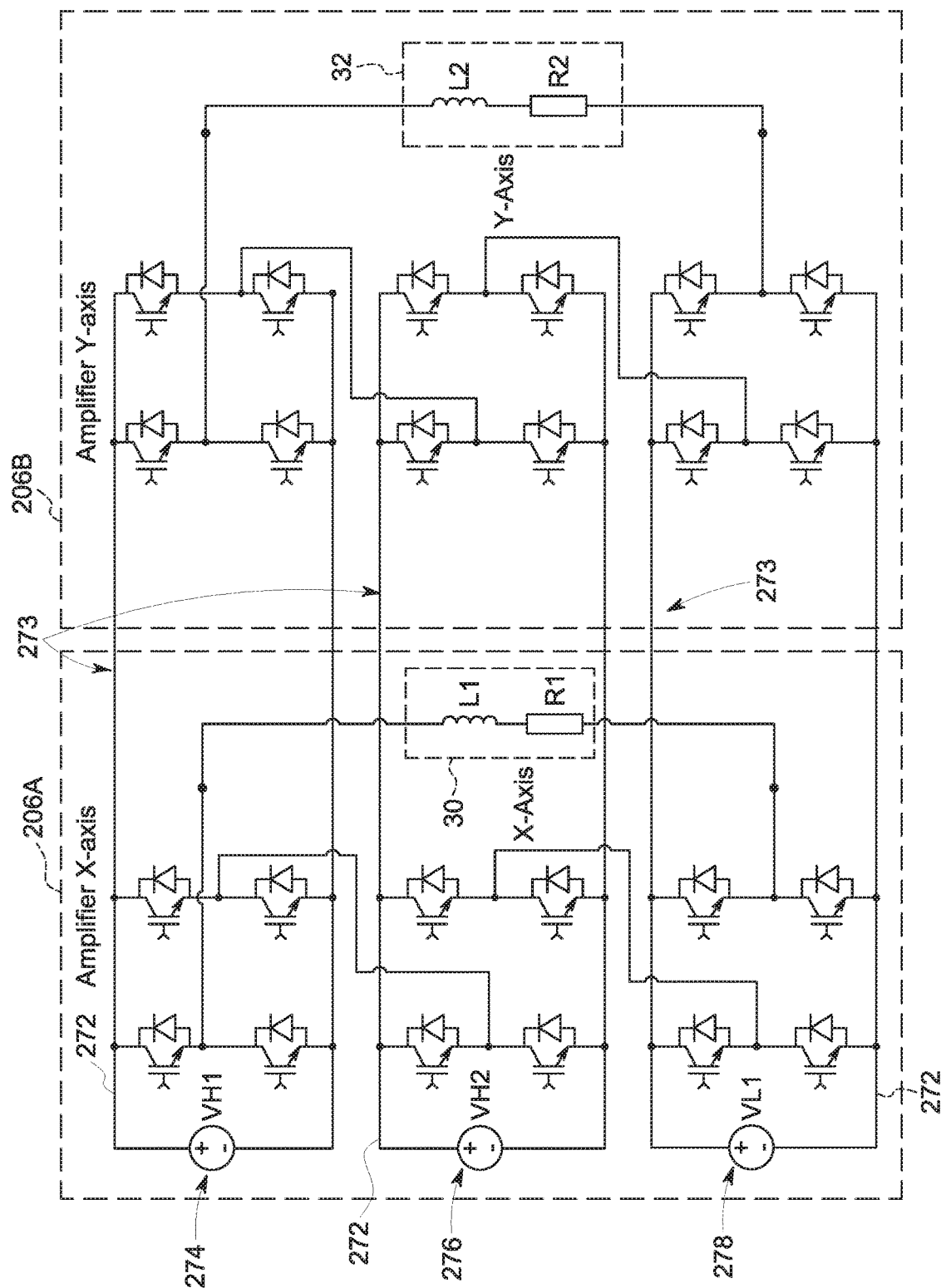
FIG. 4B is a diagram of traditional gradient amplifiers with a H-bridge design and with isolated DC buses, in accordance with an embodiment.
Figure 4C:
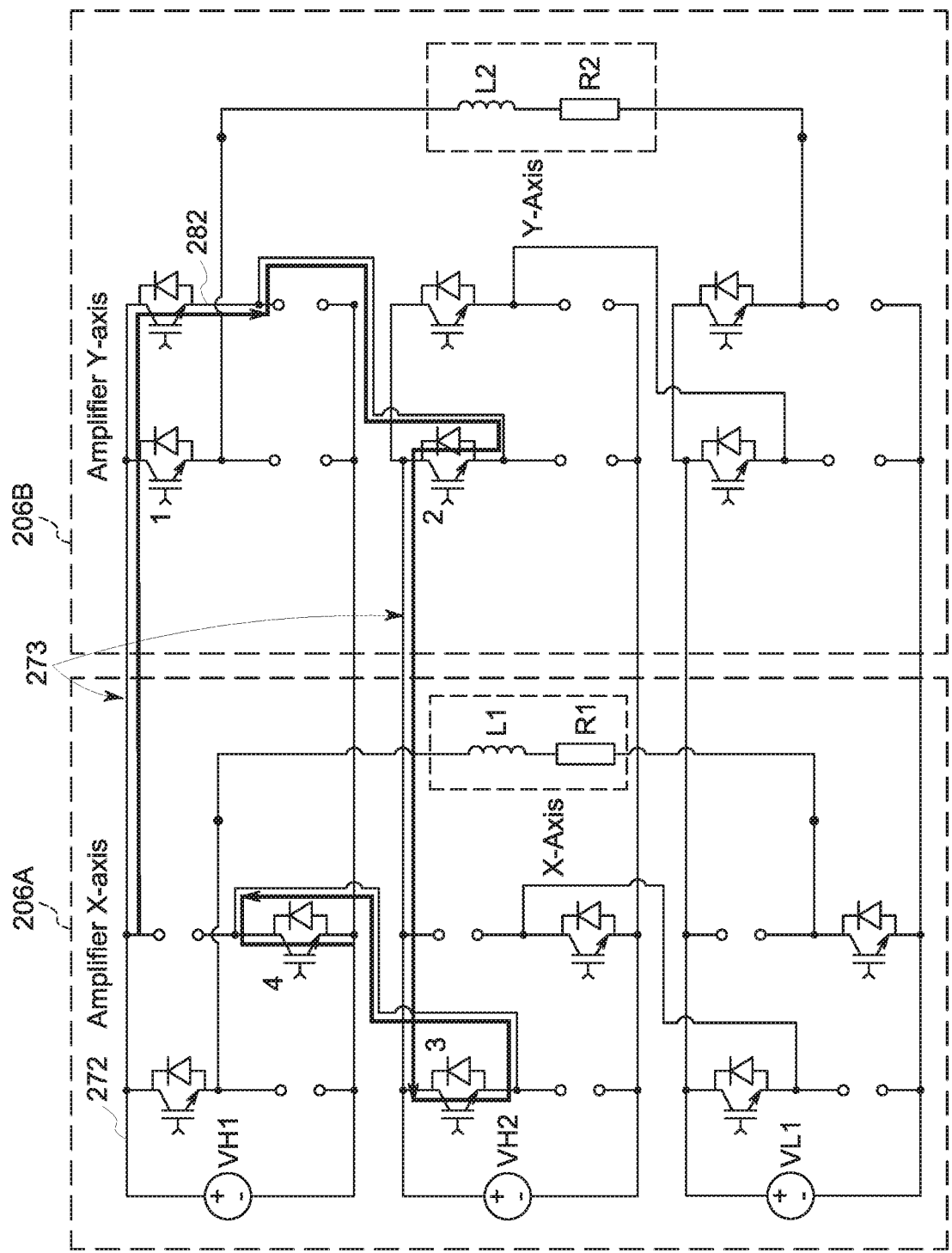
FIG. 4C is a diagram of the traditional gradient amplifiers of FIG. 4B in a configuration that causes a short circuit.

The diagrams in FIGS. 4A, 4B, and 4C are illustrations provided herein to depict challenges that may arise with the use of shared DC buses in a traditional power architectures, such as the gradient power architecture 200 illustrated in FIG. 3. FIG. 4A illustrates, by means of an example, two gradient amplifiers, gradient amplifier 206A and gradient amplifier 206B. In this example, each gradient amplifier receives three DC power signals through a dedicated DC bus. The gradient amplifier 206A receives, via the dedicated DC bus 207A, two high voltage DC signals 220A and 222A, and a low voltage DC signal 224A. In the example, the gradient amplifier 206A is constructed using 3 semiconductor bridges 230A, 230B, and 230C. The semiconductor bridges are cascaded to form a multilevel converter. Each semiconductor bridge may be powered independently and, thus, receive a DC signal. As illustrated in this example, semiconductor bridge 230A is powered by the DC signal 220A, and may be coupled to output terminal 244 and with one leg of the semiconductor bridge 232A. In its turn semiconductor bridge 232A, which is powered by the DC signal 222A is coupled with one leg of the semiconductor bridge 234A. The semiconductor bridge 234A, which is powered by the DC signal 224A, is coupled to the output terminal 242. As understood in the art, the switches in semiconductor bridges 234A, 234B, and 234C can be turned on and off at a high frequency with a variable duty ratio to control the currents provided between terminals 242 and 244. The voltage output of the gradient amplifier 206A, across output terminals 242 and 244, may be used to drive the current in the gradient coil 30.

The gradient amplifier 206B, in FIG. 4A is arranged in a manner similar to the gradient amplifier 206A. The three semiconductor bridges 230B, 232B, and 234B, are powered by DC signals 220B, 222B, and 224B, respectively, via the dedicated DC bus 207B. The three semiconductor bridges are arranged in cascade to form the multilevel converter, and provide an output to terminals 252 and 254. The voltage output between terminals 252 and 254 drives a current in the second gradient coil 32. The current output in the gradient coil 32 can be controlled by turning on or off the switches in the semiconductor bridges 230B, 232B, and 234B at a high frequency. It should be noted that, in the system of FIG. 4A, dedicated DC buses 207A and 207B are separated, isolating the DC signals 220A and 220B, 222A and 222B, and 224A and 224B. FIG. 4B illustrates gradient amplifiers 206A and 206B similar to that of FIG. 4A, but with the contrast that the amplifiers are powered by a shared DC bus 272. As a result of the use of the shared bus 272, the gradient amplifiers 206A and 206B presents a coupling 273.

In fact, due the coupling 273, the system illustrated in FIG. 4B may suffer from DC voltage shoot-through fault during operation. Note that, both gradient amplifiers 206A and 206B receive, via the shared DC bus 272, the same DC signals 274, 276, and 278, coupled via the coupling 273. Note, moreover, that the state of the switches in gradient amplifier 206A is independent from the state of switches in gradient amplifier 206B, as gradient coils 30 and 32 may be independently driven. As a result, short-circuits across the shared DC bus 272 may occur for certain states of the switches in the gradient amplifiers 206A and 206B. In fact, FIG. 4C illustrates a state of the switches in which a short circuit 282 on the shared DC bus 272 occurs. Due to the arrangement of switches, the short circuit 282 across the gradient amplifiers 206A and 206B may cause mal-function. Thus, as illustrated, gradient amplifiers implemented using a multilevel converter design with H-bridges, such as the gradient amplifiers 206A and 206B of FIG. 4B, may be vulnerable to short circuits, when powered with the shared DC bus 272.

Traditional power architectures, such as the gradient power architecture 200, may also suffer from high common-mode voltage stress in the gradient power supplies 204A, 204B, and 204C, and/or in the gradient amplifiers 206A, 206B, and 206C of FIG. 3. Traditional power architecture 200 makes use of multilevel converters operating at high frequencies. In fact, the combined switching frequency in the gradient amplifiers 206A, 206B, and 206C may reach several tens of kHz. As a result of this high frequency switching, the circuits on the secondary side (i.e., the isolated DC voltage side) of the gradient power supplies 204A, 204B, and 204C, as well as the DC-link capacitor and bridges of the gradient amplifiers 206A, 206B, and 206C, may be subject to high frequency voltages relative to the ground (e.g., a safety ground, a system ground). These high frequency voltages may cause common-mode voltage stress in the cables, transformers, capacitors, and high-speed diodes. To prevent the common-mode voltage stress from causing damage, insulation requirements may be stringent. Further complicating the design, the common mode currents induced due to common-mode voltages in the system may also affect the fidelity of the amplifier, and may cause undesirable imaging artifacts. To reduce the high insulation requirement in the gradient coils 30, 32, and 34, the output of the amplifiers can be center-point safety grounded in gradient filters 208.

Figure 5:
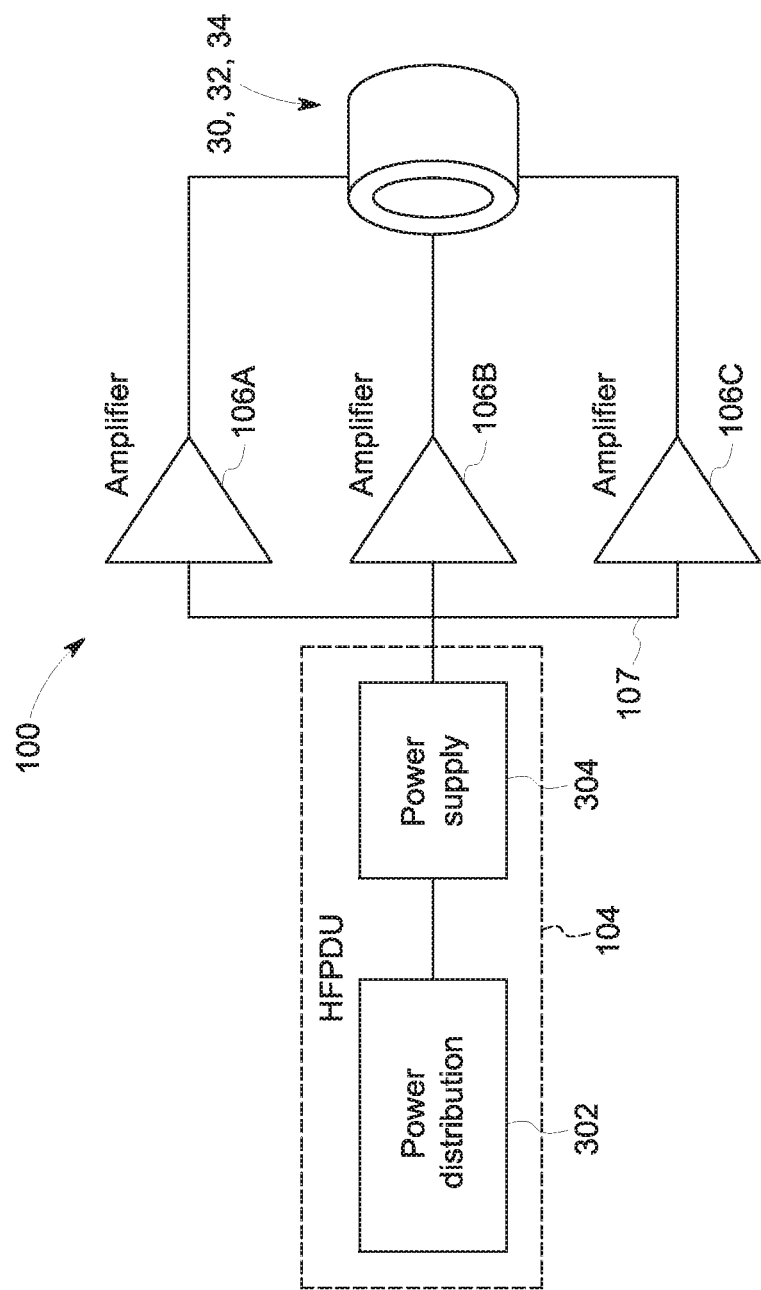
FIG. 5 is a diagram of an integrated power architecture having a high-frequency power distribution unit (HFPDU) and a shared DC bus to drive the gradient amplifiers, in accordance with an embodiment.
Figure 6:
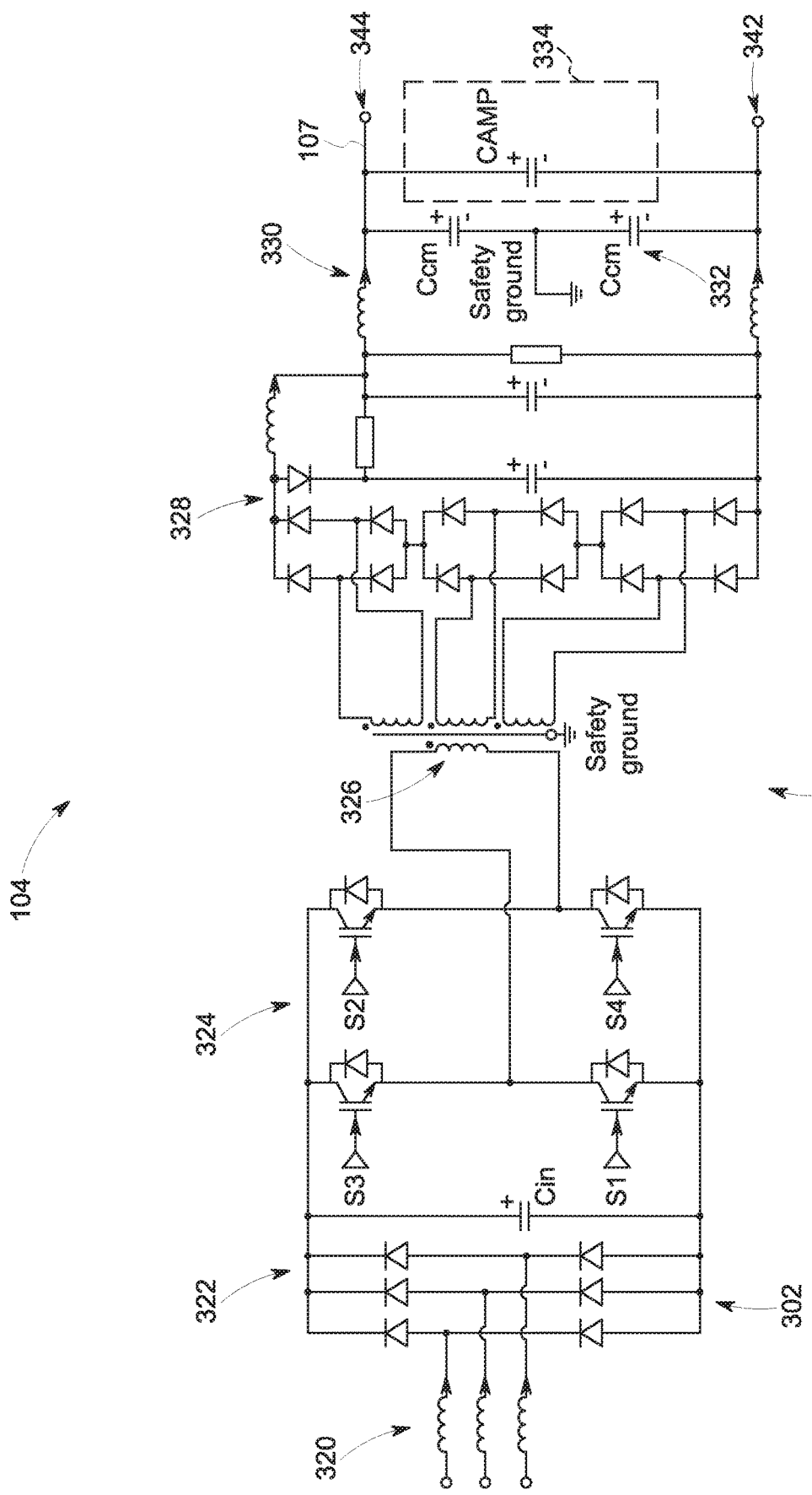
FIG. 6 is a diagram of a high-frequency power distribution unit (HFPDU), in accordance with an embodiment.
Figure 7:
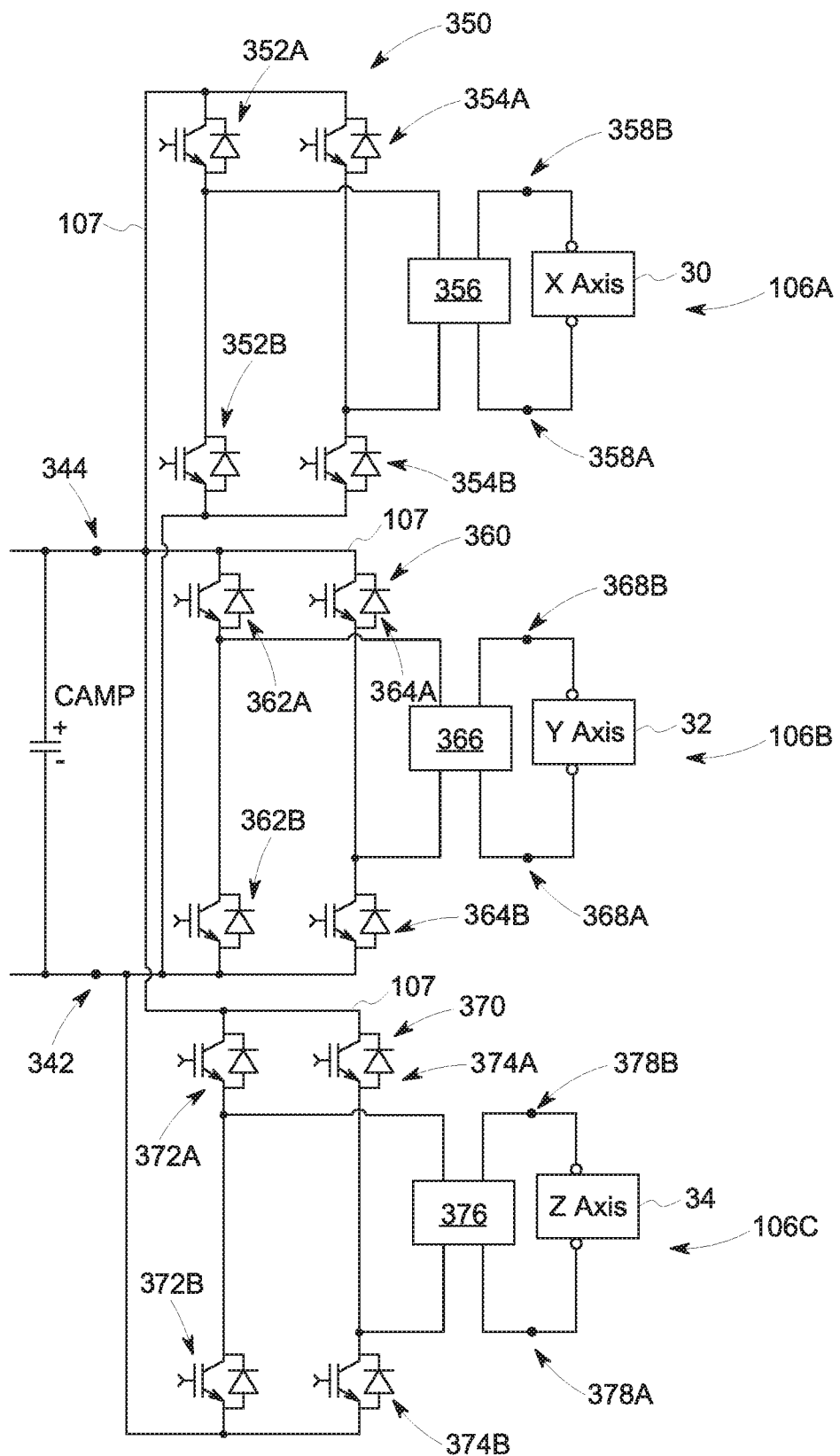
FIG. 7 is a diagram of gradient amplifiers with a single bridge design, and with shared DC buses, in accordance with an embodiment.

In view of the challenges presented by traditional architectures, such as the gradient power architecture 200, FIGS. 5, 6 and 7 illustrate features of the gradient power architecture 100 discussed in FIG. 2. The features discussed herein may benefit by, among other things, facilitate the use of shared DC buses and the addition of points for suitable grounding of the power circuitry. As a result, the design of the gradient power architecture 200 may decrease the replication of large and/or expensive components, reduce of the insulation requirements, reduce electrical stress due to common mode current leakage, and improve of the spatial encoding provided by the gradient coils 30, 32, and 34. As illustrated in FIG. 5 the gradient power architecture 100 may employ an integrated HFPDU 104 that provides DC signals to the gradient amplifiers 106A, 106B, and 106C. These DC signals may be provided by the shared DC bus 107. In some embodiments, the output DC signal in the shared DC bus 107 may have a voltage of in a range from 350V-2 kV. The HFPDU 104 may include a power distribution unit 302 and a single power supply 304.

FIG. 6 illustrates an electrical diagram for an embodiment for the HFPDU 104. The HFPDU 104 includes the power distribution unit 302 and the power supply 304. The power distribution unit 302 is coupled to the three phase power terminals of the main power supply of the MRI system (e.g., main power supply 40), and produce an intermediate DC signal provided to the power supply 304. The power distribution unit 302 may include a line-side filter 320 and a rectifier circuit 322. The power supply 304 may receive the unregulated intermediate DC signal from the power distribution unit 302 and create a regulated output DC signal provided to the gradient amplifiers via DC bus 107. The power supply unit 304 includes H-bridge 324, a high frequency transformer 326, high-speed rectifiers 328, a filter circuit 330, the grounding Y-capacitor circuit 332, and a capacitor bank 334. As a result of this architecture, the HFPDU 104 may obviate the use of a bulky transformer. In fact, the power distribution unit 302 may be powered using different voltage levels and/or signal frequencies based on the electrical specification of the different locations.

As discussed above, the power supply 304 may receive the unregulated DC signal the power distribution unit 302 and create a regulated DC signal via the shared DC bus 107. In the example, the power supply 304 may include an H-bridge 324, which provides, via the high frequency transformer 326, an internal high-frequency AC signal. In its turn, the rectifier 328 produces a DC signal, which may be provided to the DC bus 107. Filter circuitry 330 may be used to filter noise produced in the rectifier 328. In the gradient power circuitry, capacitor bank 334 be a particularly expensive component due to its dimensions and high capacitance requirement to meet peak gradient power demands. As the HFPDU 104 employs a single power supply 304, the single capacitor bank 334 used to meet the peak power demand of the three gradient amplifiers 106A, 106B, and 106C. The reduction in the number of capacitors may decrease constraints associated with dimensions and thermal dissipation of the gradient amplifiers 106A, 106B, and 106C. Moreover, since the power for the three gradient amplifiers 106A, 106B, and 106C is provided from the single power supply 304, a safety ground may be added to a midpoint in the capacitor bank 332, as illustrated. Such a grounding of the capacitor bank 332 in the shared DC bus 107 does not lead to increased insulation requirement in the gradient coils. The output of the HFPDU 104 may be taken between terminals 342 and 344 of the shared DC bus 107.

The HFPDU 104 may be coupled to the gradient amplifiers 106A, 106B, and 106C illustrated in FIG. 7. The electrical coupling illustrated is between the gradient amplifiers 106A, 106B, and 106C and the terminals 342 and 344 of the shared DC bus 107. The gradient amplifiers 106A, 106B, and 106C may be designed using single semiconductor bridges 350, 360, and 370, respectively. The single bridge design may be used in place of the H-bridge multi-level converters illustrated, for example, in FIG. 4A. The single semiconductor H-bridges 350, 360, and 370 may be implemented using switches designed with high voltage, wide band-gap devices (e.g. Silicon Carbide (SiC) devices). The high voltage, wide band-gap devices may allow accurate high-frequency control of very large currents and, thus, obviate the use of multiple H-bridges and multiple DC inputs as used in the traditional power architectures (e.g., power architecture 200 of FIG. 3).

The illustrated gradient amplifier 106A includes a single H-bridge 350. The single bridge 350 may include a first branch having switches 352A and 352B, and a second branch having switches 354A and 354B. The first branch controls the voltage at the midpoint of the first branch. Similarly, the second branch controls the voltage at the midpoint of the second branch. Terminals from the midpoints of the H-bridge 350 may be coupled to the input terminals of the ripple filter 356 and the output terminals 358A and 358B of the ripple filter 356 are coupled to the gradient coil 30. The gradient ripple filter 356 may filter the high frequency noise from the single bridge 350 and reduce the ripple content in the current flowing into the gradient coil 30.

Similarly, the illustrated gradient amplifier 106B includes a single bridge 360. The single H-bridge 360 may include a first branch having switches 362A and 362B, and a second branch having switches 364A and 364B. Terminals from the midpoint of first and the second branches of the H-bridge 360 may be coupled to the input terminals of the ripple filter 366 and the output terminals 368A and 368B of the tipple filter 366 are coupled to the gradient coil 32. The gradient ripple filter 366 may block high frequency noise from the single bridge 360 and reduce the ripple content in the current flowing into the gradient coil 32 from affecting the magnetic fields produced by gradient coil 32.

The gradient amplifier 106C employs a similar design, with the single H-bridge 370. The single H-bridge 370 may include a first branch having switches 372A and 372B, and a second branch having switches 374A and 374B. Terminals from the midpoint of the first and second branches of the H-bridge 370 may be coupled to the input terminals of the ripple filter 376 and the output terminals 378A and 378B of the ripple filter 376 are coupled to the gradient coil 34. The gradient ripple filter 376 may block high frequency noise from the single bridge 370 and reduce the ripple content in the current flowing into the gradient coil 34.

Technical effects of the embodiments presented herein include, generally, the reduction of the complexity of the power circuitry used in MRI systems. The use of an integrated HFPDU having a single power supply may allow a more compact power circuitry for the gradient subsystem of an MRI device. The HFPDU may also provide galvanic isolation and insulation, which facilitates meeting specifications for recommended means of patient protection (MOPPs). Moreover, the absence of cross-bridge connections in the gradient amplifiers may allow for an integrated DC bus, which further reduced the amount of wiring and the amount of insulation employed in the system. The shared DC bus further allows the use of a single capacitor bank, instead of multiple capacitor banks, as used in a traditional design.

It should be noted that the reduction and simplification in the size, the thermal stress, and the common mode voltage stress in the gradient amplifiers, due to the advantages discussed above, may allow the amplifier to be placed within the scan room. In fact, a single cable may be used to connect the HFPDU, located in an equipment room outside the scan room, to the gradient amplifiers, that may be placed within the scan room. The architecture may also allow flexible packaging of the parts, due to the reduction in the dimensions. For example, the gradient amplifiers may be deployed, each, in an individual package (e.g., box). Alternatively, the gradient amplifiers may share a single box, which may be in the scan room. In some systems, the gradient amplifiers may be disposed in the same box or packaging as the HFPDU.

Furthermore, the midpoint of a capacitor bank placed at the output of HFPDU may be connected to the safety ground. Such placement of the safety ground may reduce the above-discussed switching stress of the secondary side diode rectifiers, as the switching of the amplifier may not impact the common mode voltage at the terminals. This modification may lead to potential elimination of insulation failures in the secondary side diode and high frequency transformer. Finally, it should be noted that, by employing the methods and systems here described, the gradient ripple filter may become more effective and becomes primarily differential in nature as, in this design, it is subject to reduced common mode currents disturbances.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging (MRI) system, comprising:
   a plurality of gradient coils; and
   a gradient driver configured to drive the plurality of gradient coils, the gradient driver comprising:

a plurality of gradient amplifiers, wherein each gradient amplifier of the plurality of gradient amplifiers is electrically coupled to a gradient coil of the plurality of gradient coils, and wherein each gradient amplifier comprises a respective single H-bridge of semiconductor switches; and a high frequency power distribution unit (HFPDU) configured to receive an alternating current (AC) power signal from a main power source of the MRI system and to generate a direct current (DC) power signal to the plurality of gradient amplifiers via a DC bus shared by the plurality of gradient amplifiers.

2. The MRI system of claim 1, wherein the plurality of gradient coils comprise an axial gradient coil, a longitudinal gradient coil, and transversal gradient coil.

3. The MRI system of claim 2, wherein the plurality of gradient amplifiers comprise a first gradient amplifier electrically coupled to the axial gradient coil, a second gradient amplifier electrically coupled to the longitudinal gradient coil, and a third gradient amplifier electrically coupled to the transversal gradient coil.

4. The MRI system of claim 1, wherein each respective single H-bridge of semiconductor switches of each gradient amplifier comprises a respective first branch comprising a first pair of switches and a respective second branch comprising a second pair of switches.

5. The MRI system of claim 4, wherein each switch of the first pair of switches and of the second pair of switches comprises a high voltage, wide-band gap device.

6. The MRI system of claim 5, wherein the high voltage, wide-band gap devices comprises a silicon carbide (SiC) device.

7. The MRI system of claim 1, wherein the HFPDU comprises:

a power distribution unit configured to receive the AC power signal from the main power source of the MRI system and produce an intermediate DC power signal; and a power supply configured to receive the intermediate DC power signal from the power distribution and to provide the DC power signal to the DC bus, wherein the power supply comprises a transformer configured to isolate the DC power signal from the intermediate power signal.

8. The MRI system of claim 7, wherein a shield of the transformer is electrically coupled to a ground of the MRI system.

9. The MRI system of claim 7, wherein the power supply comprises a grounding capacitor circuit configured to couple a shield of the transformer to a ground of the MRI system.

* * * * *